United States Patent [19]
Ito

[11] Patent Number: 5,376,230
[45] Date of Patent: Dec. 27, 1994

[54] METHOD OF MANUFACTURING A SEMICONDUCTOR DEVICE

[75] Inventor: Masahiko Ito, Kanagawa, Japan

[73] Assignee: Sony Corporation, Tokyo, Japan

[21] Appl. No.: 977,170

[22] Filed: Nov. 16, 1992

[30] Foreign Application Priority Data

Nov. 15, 1991 [JP] Japan ................. 3-326895

[51] Int. Cl.5 ........................... H01L 21/312
[52] U.S. Cl. ........................ 156/657; 437/69; 437/70; 437/72
[58] Field of Search ............... 437/69, 70, 72; 156/657

[56] References Cited

U.S. PATENT DOCUMENTS

| | | | |
|---|---|---|---|
| 4,426,766 | 1/1984 | Lee | 437/69 |
| 4,435,225 | 3/1984 | Shideler et al. | 437/70 |
| 4,536,947 | 8/1985 | Bohr et al. | 156/657 |
| 4,611,386 | 9/1986 | Goto | 437/69 |
| 4,897,364 | 1/1990 | Nguyen et al. | 437/69 |
| 5,019,526 | 5/1991 | Yamane et al. | 437/69 |
| 5,065,218 | 11/1991 | Arimoto et al. | 437/69 |

*Primary Examiner*—Brian E. Hearn
*Assistant Examiner*—Trung Dang
*Attorney, Agent, or Firm*—Hill, Steadman & Simpson

[57] ABSTRACT

After a field oxide is formed, only a bird's beak is removed by wet etching while a resist which exposes only the bird's beak is used as a mask. When the field oxide is formed, a latent stress acts on a semiconductor substrate under the bird's beak. Since the latent stress is released when the bird's beak is removed, crystal defects do not occur. Since the mask is used, the thickness of the field oxide except for the bird's beak is not decreased. In addition, since the wet etching is performed, crystal defects do not occur during the removal of the bird's beak.

2 Claims, 5 Drawing Sheets

FIG.IA
PRIOR ART
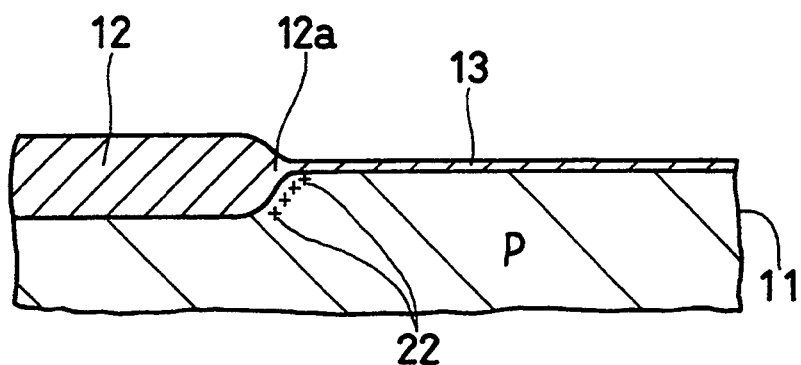
FIG.IB
PRIOR ART
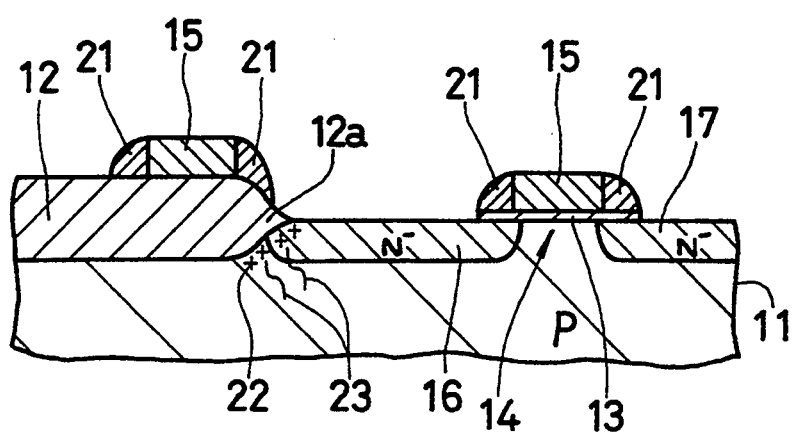

METHOD OF MANUFACTURING A SEMICONDUCTOR DEVICE

BACKGROUND OF THE INVENTION

1. Field of the Invention

The present invention relates to a semiconductor device and a method of manufacturing the same in which isolation is performed by a field oxide.

2. Description of the Prior Art

Although isolation methods are roughly classified into PN junction isolation and dielectric isolation, the dielectric isolation has been popularly used compared with the PN junction isolation. In the dielectric isolation, oxide isolation performed by a field oxide formed by local oxidation of silicon (LOCOS) method is most popularly used.

FIGS. 1A and 1B show the steps in manufacturing a conventional stacked capacitor DRAM in which isolation is performed by a field oxide formed by the above LOCOS method. In order to manufacture the conventional DRAM, as shown in FIG. 1A, an $SiO_2$ film 12 serving as a field oxide is formed on the surface of the isolation region of an Si substrate 11 by the conventional known process of the LOCOS method first, and an $SiO_2$ film 13 serving as a gate oxide is formed on the surface of an active region.

As shown in FIG. 1B, a gate electrode (i.e., a word line) of a MOS transistor 14 constituting a memory cell is formed by a polysilicon film 15 on the $SiO_2$ films 12 and 13. Thereafter, $N^-$-type layers 16 and 17 each serving as the source/drain of the MOS transistor 14 are formed in a P-type well of the Si substrate 11 while the polysilicon film 15 and the $SiO_2$ film 12 are used as masks.

An insulating film 21 is deposited on the entire surface of the resultant structure, and the entire surface of the insulating film 21 is etched back to form side walls constituted by the insulating films 21 on the side portions of the polysilicon films 15. Thereafter, a capacitor constituting a memory cell, bit line, and the like are formed to complete the conventional stacked capacitor DRAM. Note that, after the $SiO_2$ film 12 is formed by the LOCOS method, the entire surface of the $SiO_2$ film 12 may be etched without using a mask.

When the $SiO_2$ film 12 is formed by the LOCOS method, however, it is known that a bird's beak 12a is formed at an end of the $SiO_2$ film 12. In addition, as shown in FIG. 1A, the Si substrate 11 under the bird's beak 12a has a latent stress 22 or microdefects such as heavy metal contamination and cleavage of the bonds between atoms.

For this reason, when the Si substrate 11 is damaged by etchback for forming the side walls constituted by the insulating films 21, crystal defects 23 such as dislocation and stacking faults occur. As shown in FIG. 1B, the crystal defect 23 may cross the junction between the $N^-$-type layer 16 and the Si substrate 11.

As a result, junction leakage occurs at a portion where the crystal defect 23 crosses the junction between the $N^-$-type layer 16 and the Si substrate 11, poor data retention characteristics are obtained in the conventional stacked capacitor DRAM.

As described above, after the $SiO_2$ film 12 is formed by the LOCOS method, when the entire surface of the $SiO_2$ film 12 is etched without using a mask, the position of the bird's beak 12a which is the thin portion of the $SiO_2$ film 12 is recessed to release the latent stress 22, and the occurrence of the crystal defects 23 is suppressed. In this case, however, the thickness of the $SiO_2$ film 12 except for the bird's beak 12a is also decreased, thereby degrading isolation characteristics.

SUMMARY OF THE INVENTION

In a semiconductor device according to the present invention, isolation is performed by a field oxide from which a bird's beak is removed.

The first method of manufacturing a semiconductor device according to the present invention comprises the steps of forming a field oxide on a semiconductor substrate and wet-etching a bird's beak using a mask which exposes only the bird's beak of the field oxide.

According to the second method of manufacturing a semiconductor device according to the present invention, as the above wet etching, first wet etching using a first mask which exposes only a bird's beak at one end of the field oxide and second wet etching using a second mask which exposes only a bird's beak at the other end of the field oxide are performed.

As described above, in the semiconductor device according to the present invention, since the bird's beak of the field oxide is removed, a latent stress in the semiconductor substrate under an end of the field oxide is released, the occurrence of crystal defects is suppressed. For this reason, junction leakage caused by the crystal defects rarely occurs. Therefore, when the present invention is applied to a semiconductor memory device, excellent data retention characteristics can be obtained.

In the first method of manufacturing a semiconductor device according to the present invention, since the mask which exposes only the bird's beak is used, even when the bird's beak is removed, the thickness of the field oxide except for the bird's beak is not decreased. In addition, since the bird's beak is wet-etched, no crystal defects occur in the semiconductor substrate during the removal of the bird's beak. Therefore, the semiconductor device according to the present invention can be stably manufactured.

According to the second method of manufacturing a semiconductor device according to the present invention, since the bird's beaks at one end and the other end of the field oxide are independently exposed by the first and second masks, the contact areas between the field oxide and the masks are larger than the contact area between the field oxide and the mask obtained when the bird's beaks at both the ends are simultaneously exposed. For this reason, even when the field oxide is micropatterned, the masks are not removed during the wet etching, and the bird's beaks can be stable removed. Therefore, the micropatterned semiconductor device of the present invention can be stably manufactured.

BRIEF DESCRIPTION OF THE DRAWINGS

FIGS. 1A and 1B are cross-sectional views showing the steps in manufacturing a stacked capacitor DRAM according to the prior art of the present invention;

DETAILED DESCRIPTION OF THE PREFERRED EMBODIMENTS

Figure 2A:
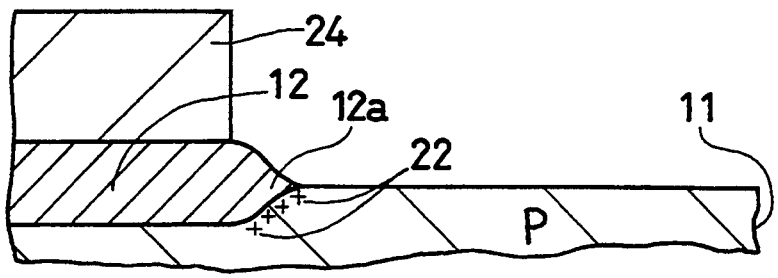
FIGS. 2A to 2C are cross-sectional views showing the steps in manufacturing a stacked capacitor DRAM along the line II—II in FIG. 3 according to the first embodiment of the present invention.

The first and second embodiments of the present invention which is applied to a stacked capacitor DRAM will be described below with reference to FIGS. 2A to 7. Note that the same reference numerals as in the prior art in FIG. 1 denote the same parts in the embodiments.

Figure 2B:
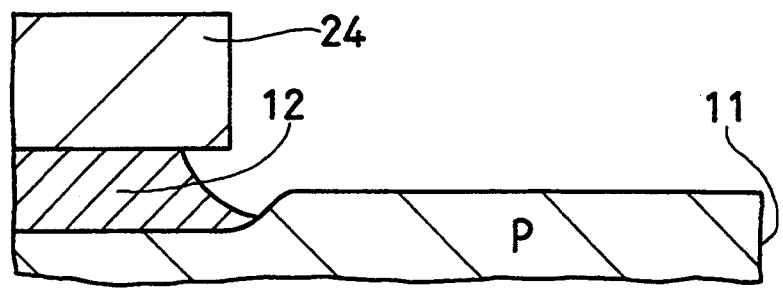
Figure 2C:
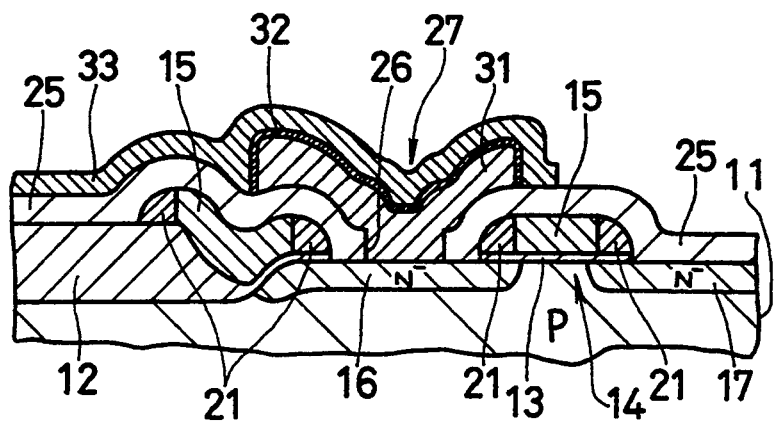
Figure 3:
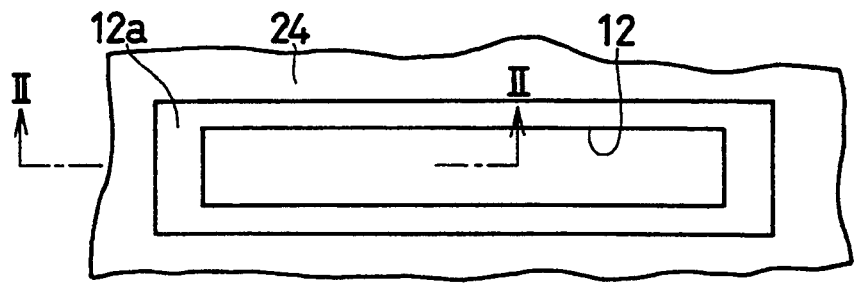
FIG. 3 is a plan view showing a step according to the first embodiment of the present invention.

FIGS. 2A to 3 show the first embodiment. In the first embodiment, as shown in FIG. 2A, an $SiO_2$ film 12 serving as a field oxide is formed on the surface of the isolation region of an Si substrate 11 by the conventional known process of the LOCOS method first. Therefore, a bird's beak 12a is formed at an end of the $SiO_2$ film 12.

In the first embodiment, however, as shown in FIGS. 2A and 3, a resist 24 having a pattern for exposing only the bird's beak 12a of the $SiO_2$ film 12 is formed. The bird's beak 12a is wet-etched with a hydrofluoric-acid-based etching solution while the resist 24 is used as a mask so as to remove only the bird's beak 12a as shown in FIG. 2B.

As shown in FIG. 2C, after the resist 24 is removed, the same steps as those of the prior art shown in FIG. 1A and 1B are performed to form a MOS transistor 14. Polysilicon films 15 serving as gate electrodes and the like are covered with an interlayer insulator 25, and a contact hole 26 reaching an $N^-$-type layer 16 is formed in the interlayer insulator 25.

Thereafter, a polysilicon film 31 serving as the lower electrode of a capacitor 27 constituting a memory cell is brought into contact with the $N^-$-type layer 16, and a dielectric film 32 of the capacitor 27 and a polysilicon film 33 serving as the upper electrode are sequentially formed. A bit line which is in contact with an $N^-$-type layer 17 and the like are formed, thereby completing the first embodiment.

In the above first embodiment, when the $SiO_2$ film 12 is formed, as shown in FIG. 2A, a latent stress 22 acts on the Si substrate 11 under the bird's beak 12a. However, since the latent stress 22 is released when the bird's beak 12a is removed in the step in FIG. 2B, as shown in FIG. 2C, no crystal defects 23 occur in the Si substrate 11.

More specifically, as shown in FIG. 2C, at a portion where the bird's beak 12a is removed, a recess portion is formed in the surface of the Si substrate 11, and the $N^-$-type layer 16 is relatively deeply formed. For this reason, even when microdefects are present at the same position as the position where the latent stress 22 is present or near the position, the microdefects are covered with the $N^-$-type layer 16. Therefore, in the first embodiment, leakage rarely occurs in the junction between the $N^-$-type layer 16 and the Si substrate 11, and data retention characteristics are good.

Figure 4A:
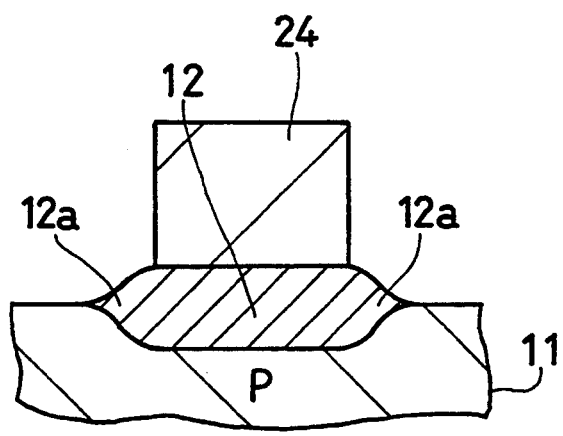
FIGS. 4A to 4C are cross-sectional views showing a problem to be solved by the present invention.
Figure 4B:
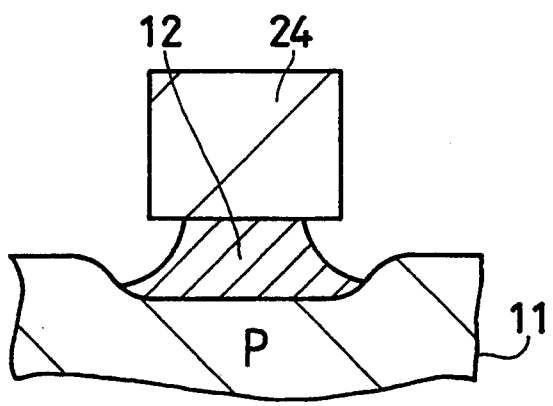
Figure 4C:
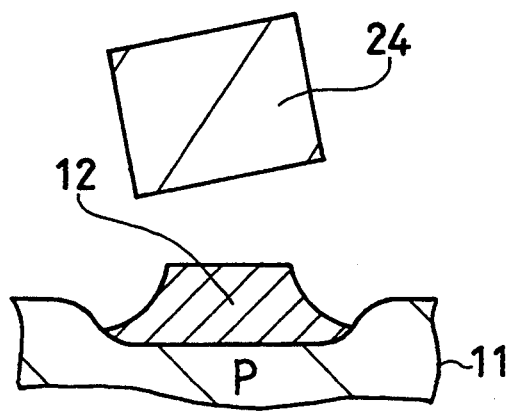

As the integration level of semiconductor devices is increased, the pattern of a field oxide is micropatterned, thereby decreasing the width of the field oxide. For this reason, as shown in FIG. 4A, when the length of the small side of the contact surface between the $SiO_2$ film 12 and the resist 24 is decreased to about 1 $\mu$m or less to decrease the contact area, and the $SiO_2$ film 12 is wet-etched using the resist 24 as a mask as shown in FIG. 4B, the resist 24 is peeled from the $SiO_2$ film 12 during the wet etching as shown in FIG. 4C.

As described above, when the resist 24 is peeled during the wet etching, the bird's beak 12a of the $SiO_2$ film 12 cannot be stably removed, and the stacked capacitor DRAM of the first embodiment shown in FIGS. 2A to 2C cannot be stably manufactured. Four this reason, the second embodiment capable of solving the above problem will be described below.

Figure 5A:
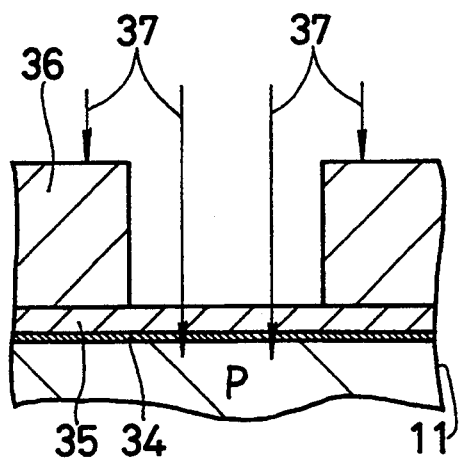
FIGS. 5A to 5E are cross-sectional views showing the steps according to the second embodiment of the present invention.
Figure 5B:
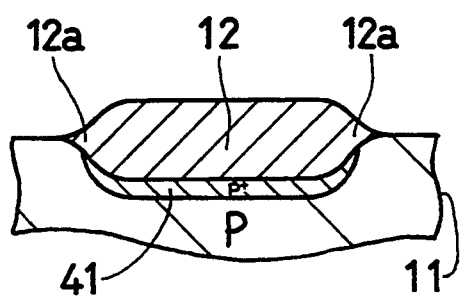
Figure 5C:
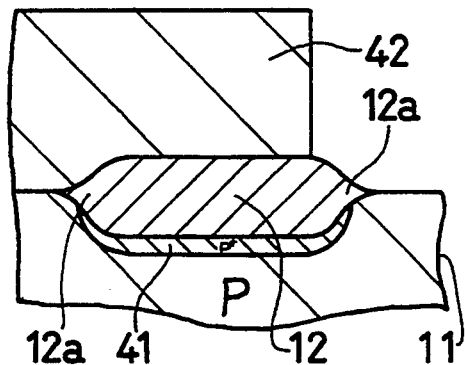
Figure 5D:
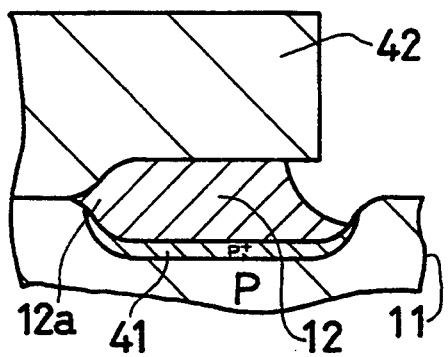
Figure 5E:
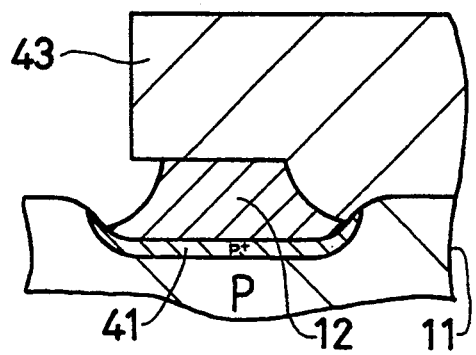
Figure 6:
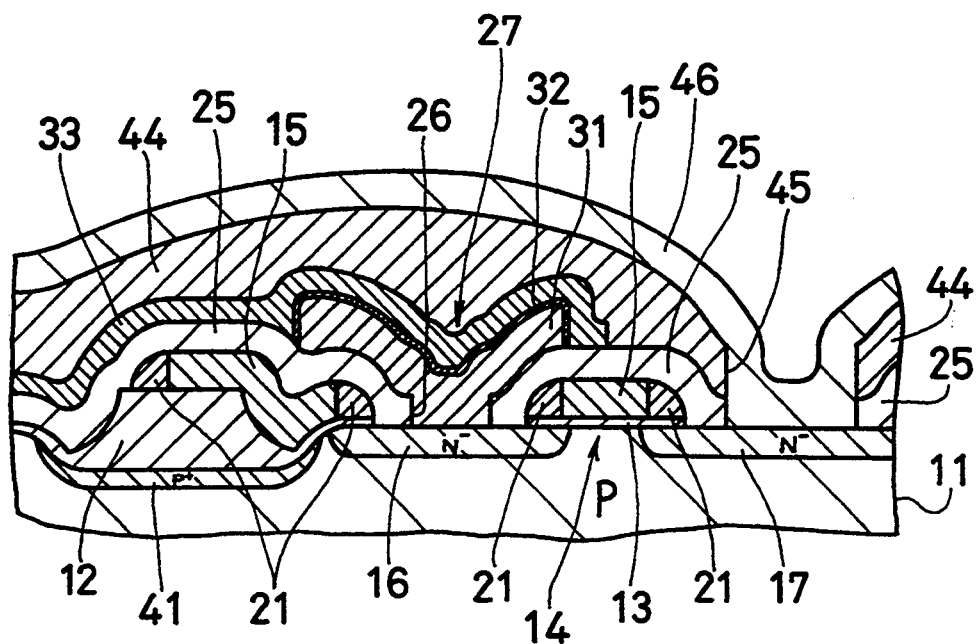
FIG. 6 is a cross-sectional view showing the stacked capacitor DRAM manufactured in the second embodiment.

FIGS. 5A to 6 show the second embodiment of the present invention. In the second embodiment, as shown in FIG. 5A, after a P-type well is formed in an Si substrate 11, the surface of the Si substrate 11 is oxidized to form an $SiO_2$ film 34 serving as a pad and having a thickness of about 30 nm, and an SiN film 35 having a thickness of about 100 nm is deposited on the $SiO_2$ film 34 by low-pressure CVD.

Thereafter, a resist 36 on the SiN film 35 is processed to have a pattern for an active region. Boron 37 for forming a channel stopper is ion-implanted in the Si substrate 11 at an acceleration energy of about 25 keV and a dosage of about $1 \times 10$ $cm^{-2}$ using the resist 36 as a mask.

The SiN film 35 is patterned using the resist 36 as a mask, and the resist 36 is removed. A LOCOS method is performed using the SiN film 35 as an oxidation resistive film to form an $SiO_2$ film 12 and a $P^+$-type layer 41 serving as a channel stopper as shown in FIG. 5B. Note that the SiN film 35 is removed after the LOCOS method is performed.

As shown in FIG. 5C, a resist 42 having a pattern which covers the $SiO_2$ film 12 including a bird's beak 12a at the other end of the $SiO_2$ film 12 except for only a bird's beak 12a at one end of the $SiO_2$ film 12 is formed. The bird's beak 12a at one end is wet-etched with a hydrofluoric-acid-based etching solution while the resist 42 is used as a mask, and only the bird's beak 12a at one end is removed as shown in FIG. 5D.

As shown in FIG. 5E, the resist 42 is removed, a resist 43 having a pattern which covers the $SiO_2$ film 12 except for only the bird's beak 12a at the other end of the $SiO_2$ film 12 is formed. The bird's beak 12a at the other end is wet-etched with a hydrofluoric-acid-based etching solution while the resist 43 is used as a mask, and only the bird's beak 12a at the other end is removed.

Thereafter, as shown in FIG. 6, the same steps as those of the first embodiment are performed, after a polysilicon film 33 serving as the upper electrode of a capacitor 27 is formed, an interlayer insulator 44, a contact hole 45 reaching the $N^-$-type layer 17, a polysilicon film 46 serving as a bit line and the like are formed, thereby completing the second embodiment.

In the above first and second embodiments s the present invention is applied to a stacked capacitor DRAM. However, the present invention can be applied other semiconductor devices such as an SRAM, and materials different from those of the first and second embodiment can be used.

Figure 7:
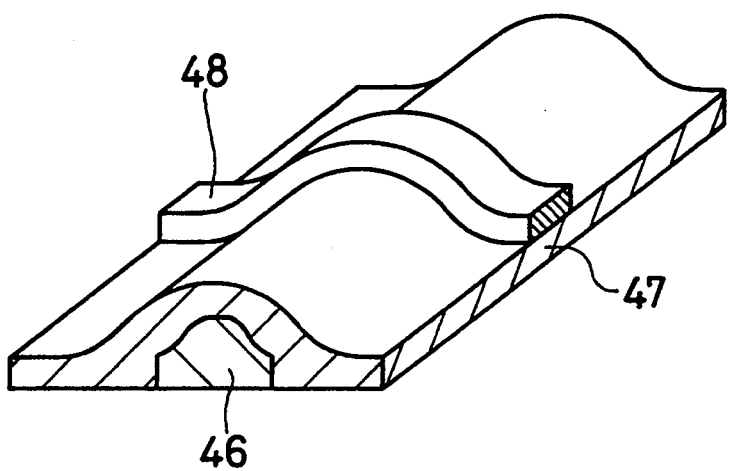
FIG. 7 is a perspective view showing an application of the present invention including a section of a main part of the stacked capacitor DRAM.

As an application of the present invention, for example, when both the shoulder portions of the polysilicon film 46 serving as the bit line of the second embodiment shown in FIG. 6 are wet-etched to have a moderate shape as shown in FIG. 7, the step coverage of an interlayer insulator 47 covering the polysilicon film 46 and the step coverage of an Al wiring 48 on the interlayer insulator 47 can be improved, and the production yield of semiconductor devices can be increased.

What is claimed is:

1. A method of manufacturing a semiconductor device, comprising the steps of:

forming a field oxide on a semiconductor substrate said field oxide having a first edge with a first bird's beak and a second edge with a second bird's beak opposite the first edge, each bird's beak causing latent stresses in the substrate adjacent each bird's beak; and removing the latent stresses by applying a first mask on the field oxide covering the second bird's beak and exposing only the first bird's beak, then wet-etching the first bird's beak to remove the bird's beak and to remove the latent stresses in the substrate adjacent thereto, immediately removing the first mask and immediately applying a second mask covering the field oxide and substrate adjacent the position of the first bird's beak with the second bird's beak being exposed and then wet-etching the second bird's beak to remove the second bird's beak and the stresses in the adjacent substrate.

2. A method according to claim 1, wherein said wet etching uses a hydrofluoric-acid based etching solution.

* * * * *